(12) United States Patent
Fang et al.

(10) Patent No.: US 7,964,474 B2
(45) Date of Patent: Jun. 21, 2011

(54) USE OF FIELD OXIDATION TO SIMPLIFY CHAMBER FABRICATION IN MICROFLUIDIC DEVICES

(75) Inventors: Ming Fang, Plano, TX (US); Fuchao Wang, Plano, TX (US)

(73) Assignee: STMicroelectronics, Inc., Coppell, TX (US)

( * ) Notice: Subject to any disclaimer, the term of this patent is extended or adjusted under 35 U.S.C. 154(b) by 99 days.

(21) Appl. No.: 12/422,723

(22) Filed: Apr. 13, 2009

(65) Prior Publication Data
US 2010/0167497 A1 Jul. 1, 2010

Related U.S. Application Data

(60) Provisional application No. 61/142,153, filed on Dec. 31, 2008.

(51) Int. Cl.
*H01L 21/76* (2006.01)
(52) U.S. Cl. ...... 438/443; 438/52; 438/53; 257/E21.249

(58) Field of Classification Search ............ 438/21, 438/53, 443, 50, 52, 439; 347/56–58; 257/E21.249
See application file for complete search history.

(56) References Cited

U.S. PATENT DOCUMENTS

| 7,071,031 B2 * | 7/2006 | Pogge et al. | 438/109 |
| 2004/0104973 A1 * | 6/2004 | Huang et al. | 347/58 |
| 2008/0124873 A1 * | 5/2008 | Lee et al. | 438/276 |

* cited by examiner

*Primary Examiner* — Matthew S Smith
*Assistant Examiner* — Christine Enad
(74) *Attorney, Agent, or Firm* — David V. Carlson; Lisa K. Jorgenson

(57) ABSTRACT

A method includes growing a first oxide region concurrently with a second oxide region in a substrate and forming an inlet path to the first oxide region, the inlet path exposing a first surface of the first oxide region. The method also includes removing the first oxide region to form a chamber, forming a first MOS transistor adjacent the second oxide region, and forming a second MOS transistor separated from the first MOS transistor by the second oxide region.

19 Claims, 9 Drawing Sheets

USE OF FIELD OXIDATION TO SIMPLIFY CHAMBER FABRICATION IN MICROFLUIDIC DEVICES

BACKGROUND

1. Technical Field

The present disclosure relates to a process of forming a chamber for microfluidic and micro-electromechanical devices, and more particularly, to forming field oxide regions defining a first portion of the chamber concurrently with forming isolation regions for integrated circuit components.

2. Description of the Related Art

Micro-electromechanical systems (MEMS) in semiconductors have arisen for various applications to sense temperature, pressure, strain, acceleration, rotation, and chemical properties of liquids and gases. Those MEMS structures are usually combined with other integrated circuits (IC), such as metal oxide semiconductor (MOS) circuits or complimentary metal oxide semiconductor (CMOS) circuits, for analyzing and calculating sensed parameters or for controlling components of the MEMS. Therefore, the MEMS manufacturing processes are required to be compatible with the existing MOS or CMOS manufacturing processes such that the whole system is inexpensive, reliable, and compact.

In MEMS applications for fluid processing, fluid is often held in a chamber where it is heated. The most common application is inkjet printer heads. Other applications include analyzing enzymes and proteins, biological examinations, and amplifying DNA.

Inkjet technology relies on placing a small amount of ink within an ink chamber, rapidly heating the ink, and ejecting it to provide an ink drop at a selected location on an adjacent surface, such as a sheet of paper. Currently, formation of the ink chamber includes forming a sacrificial borophosphosilicate glass (BPSG) on top of a wafer by deposition, pattern, etch, and reflow. A low stress silicon nitride is deposited, patterned, and etched over the BPSG layer and heater elements are formed.

IC components that provide an electrical current to the heater elements are formed in processes separate from the chamber formation process. Typically, the IC components are formed after deposition of the sacrificial material that defines the future chamber. IC components may be transistors having source, drain, and gate regions at a location spaced from the chamber and heater elements. To avoid parasitic conduction between adjacent transistors, field oxide regions are grown on the substrate to adequately insulate source and drain regions of adjacent transistors.

Other MEMS applications such as pressure sensors, microphones, and accelerometers include chambers, recesses, and/or trenches, which are formed and filled with sacrificial materials. The formation of the chambers, recesses, or trenches occurs in different process stages from those forming the IC components. By forming the IC components in parallel with formation of the chamber, recesses, or trenches, the manufacturing process complexity is reduced, which translates into lower costs and greater efficiency.

BRIEF SUMMARY

The present disclosure describes a method of forming a chamber for a MEMS device, where a first portion of the chamber forms concurrently with field oxide regions of IC components. The method includes growing a first oxide region and a second oxide region concurrently in a substrate, the first oxide region corresponding to a first portion of the chamber and the second region corresponding to an isolation region separating IC components.

The MEMS device may have an inlet path for fluid and a nozzle (an exit path) for ejection of a fluid. The fluid may be of the type that needs to be heated to selected temperatures for a desired purpose, for example an inkjet printer, DNA amplification, or chemical analysis.

The method may also include forming a heater element and an interconnection to couple the heater to an IC control circuit to generate heat in the chamber, and removing the field oxide to expose the first portion of the chamber. Subsequently, the substrate is etched to form the final chamber shape, the chamber being in fluid communication with the path, the nozzle, and a surrounding environment.

BRIEF DESCRIPTION OF THE SEVERAL VIEWS OF THE DRAWINGS

The foregoing and other features and advantages of the present disclosure will be more readily appreciated as the same become better understood from the following detailed description when taken in conjunction with the accompanying drawings.

DETAILED DESCRIPTION

Figure 1:
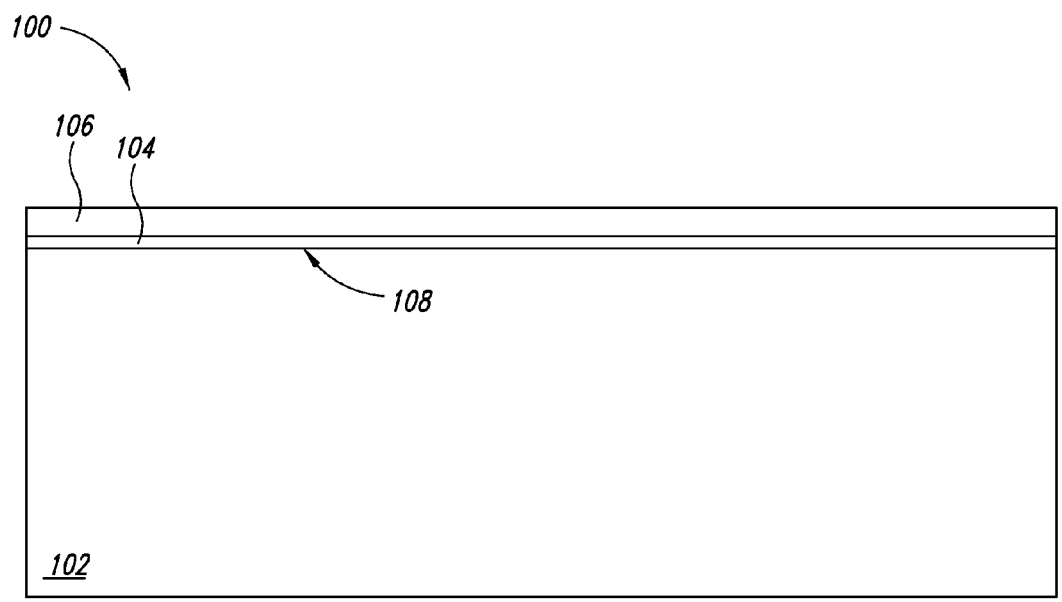
FIGS. 1-11 are schematic cross-sections of different stages in a manufacturing process for forming a fluid chamber according to one embodiment of the present disclosure.

In the following description, certain specific details are set forth in order to provide a thorough understanding of various embodiments of the disclosure. However, one skilled in the art will understand that the disclosure may be practiced without these specific details. In other instances, well-known structures associated with electronic components and semiconductor fabrication have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

In the drawings, identical reference numbers identify similar elements or acts. The size and relative positions of elements in the drawings are not necessarily drawn to scale.

As used in the specification and appended claims, the use of "correspond," "corresponds," and "corresponding" is intended to mean a ratio of or a similarity between referenced objects. The use of "correspond" or one of its forms should not be limited to mean the exact shape or size.

FIGS. 1-11 illustrate different stages of a manufacturing process for forming a fluid chamber assembly 100. The complete microfluidic chamber assembly 100, illustrated in FIG. 11, generally receives fluids from off of the chip for on-chip handling of small volumes of fluid. One common use of such systems is inkjet printer heads.

The process simplifies the manufacturing of devices with fluid chambers and IC components. In the prior art, the chambers are formed during different stages of the process than the IC components. On the other hand, the process described in this disclosure forms a portion 168 of a chamber 164 concurrently with formation of a field oxide isolation region 118 between IC components, like transistors 120, 121 (see FIGS. 10, 11).

Referring initially to FIG. 1, assembly 100 includes a substrate 102, which can be a monocrystalline semiconductor material such as silicon. The substrate 102 can be doped with a desired conductivity type, either P-type or N-type. In one embodiment, the substrate 102 is 680 microns thick.

A pad oxide layer 104 is formed, either by growth or deposition, over a top surface 108 of the substrate 102. The pad oxide 104 may be a silicon oxide layer with P- or N-type impurities with a thickness in the range of 20 to 100 Angstroms. The pad oxide 104 is formed to protect the substrate 102 from undesirable interactions in other stages of the process.

For field oxidation or local oxidation, the areas of the substrate 102 that are not to be oxidized must be protected by a material that does not allow oxygen diffusion at typical oxidation temperatures. Silicon nitride ($Si_3N_4$) is one material that is compatible with the silicon substrate 102 during oxidation.

Figure 2:
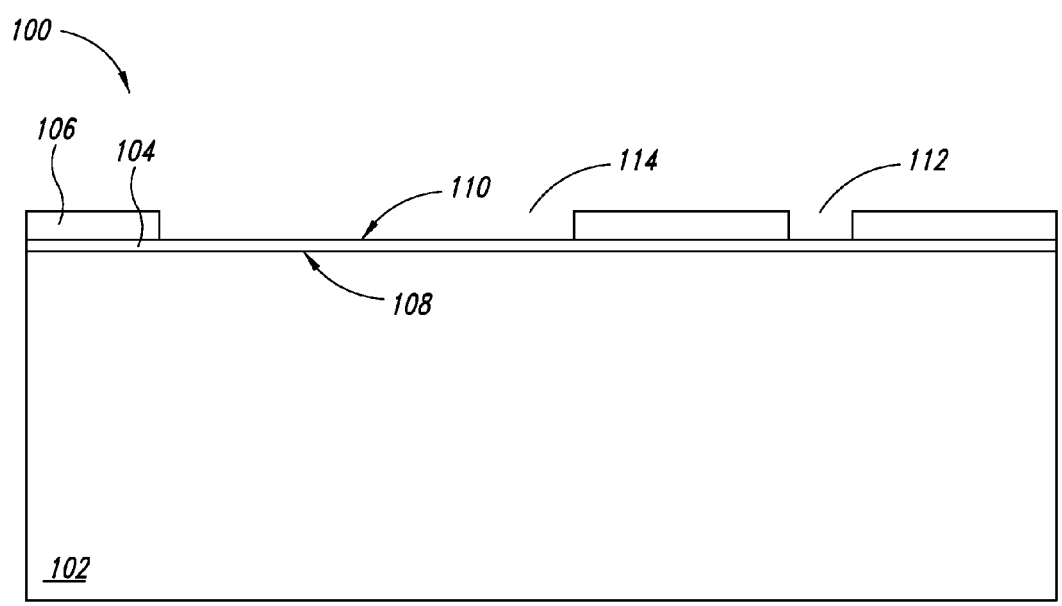

Subsequently, a nitride layer 106 covers the pad oxide layer 104. FIG. 2 illustrates apertures 114 and 112, which are formed by applying a pattern and then etching the nitride layer 106. An annealing step may be performed prior to formation of the nitride layer 106, to strengthen and toughen the pad oxide 104. The widths of aperture 114 and aperture 112 correspond to widths of the fluid chamber 164 and of the field oxide isolation region 118, respectively, to be formed in a later stage of the process (see FIG. 11). Formation of the chamber 164 and the isolation region 118 will be described in more detail below. The width and locations of the apertures 114 and 112 are preselected by a manufacturer to produce a device that meets desired performance characteristics.

Figure 3:
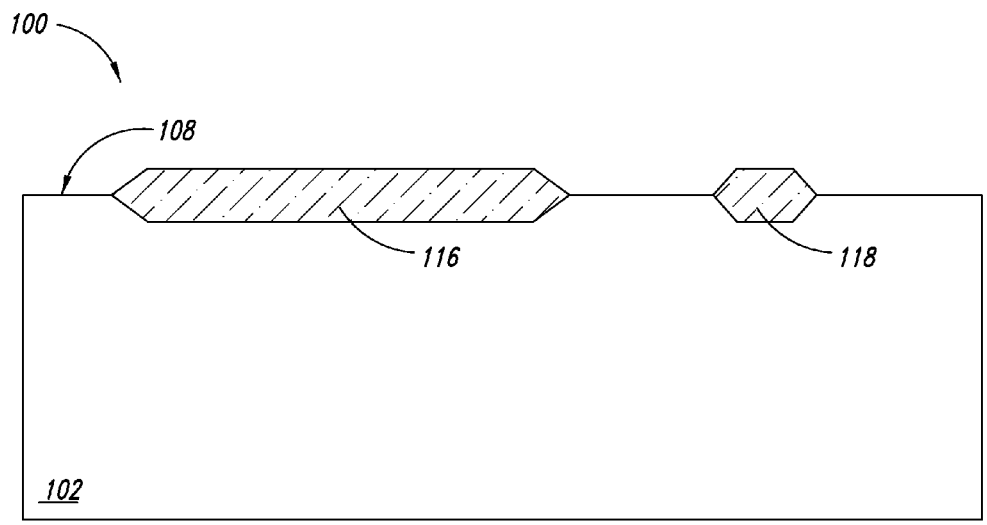

An upper surface 110 of the pad oxide 104 is exposed through apertures 114 and 112. As illustrated in FIG. 3, field oxide regions 116 and 118 are grown on the exposed surface 110 of the pad oxide 104 at apertures 114 and 112 by wet or dry thermal oxidation. When exposed to oxygen, the surface 110 oxidizes to form native silicon dioxide ($SiO_2$). Wet oxidation techniques generally grow thicker field oxide regions in a shorter amount of time. However, either technique is acceptable. The technique to form the field oxide regions 116 and 118 is also referred to as local oxidation of silicon (LOCOS). Current thermal oxidation techniques can form the field oxide regions 116 and 118 by heating the substrate in an atmosphere in a furnace that contains pure oxygen or water vapor. Both of these molecules diffuse easily through the growing $SiO_2$ layer at high temperatures. During the oxidation reactions the difference between the densities of Si and $SiO_2$ results in about 46% of the silicon surface being consumed.

For ease of illustration, as illustrated in FIG. 3, the field oxide regions 116, 118 extend above and below the surface 108 of the substrate by equal amounts. In addition, lateral oxidation leads to a "bird's beak" configuration as illustrated by the tapered lateral edges of field oxide regions 118 and 116. After growing the field oxide regions 116 and 118, the remaining nitride layer 106 and pad oxide layer 104 are removed to re-expose the surface 108 of the substrate 102.

As can be seen, the first portion 168 that will become the fluid chamber 164, such as for ink, is formed using the very same process steps and at the same time as the formation of the isolation oxide 118 for the transistors 120, 121 of the integrated circuit on the same substrate. In one embodiment, the isolation oxide 118 is a field oxide formed using one of the many known LOCOS techniques. Of course, if a different type of isolation oxide 118 using different steps is being used between the transistors 120, 121 of the integrated circuit, then the same type of isolation oxide can be formed to be the sacrificial oxide 116 for the first portion 168 of the chamber 164. For example, if trench isolation followed by oxide growth and/or oxide deposition is used for the isolation between transistors in the integrated circuit, then it would also be used to start the formation of the first portion 168 of the chamber 164. Thus, if the isolation is one of a number of different structures, whether shallow trench isolation, poly buffered LOCOS, or other technique, the same steps at the same time are used to form both the starting structure for the fluid chamber 164, the first portion 168, and the isolation region 118. These and other isolation techniques should be the same for both starting formation of the chamber and creating the isolation between different areas in the active integrated circuit. After growing the field oxide regions 116 and 118, the remaining nitride layer 106 and pad oxide layer 104 are removed to re-expose the surface 108 of the substrate 102.

In another embodiment, a masking layer (not shown) may be formed to protect the field oxide region 118 and the top surface 108 of the substrate adjacent the field oxide region 118. The large field oxide region 116 remains exposed and a heavy implant may be applied to the exposed substrate 102 and the field oxide region 116 in order to implant the substrate 102 with N-type or P-type conductivity. For example, a portion of the substrate below the field oxide region 116 may be heavily doped with an N-type conductivity. As can be seen below in FIGS. 14 and 15, the heavy implant may be an extension of the source region of a transistor 121.

The smaller field oxide region 118 is formed to isolate IC components from each other and will be referred to as the IC FOX 118. Although only one IC FOX is illustrated, various isolation regions may be formed concurrently with the chamber FOX 116. In one embodiment, the field oxide regions 116, 118 are one micron thick.

Figure 4:
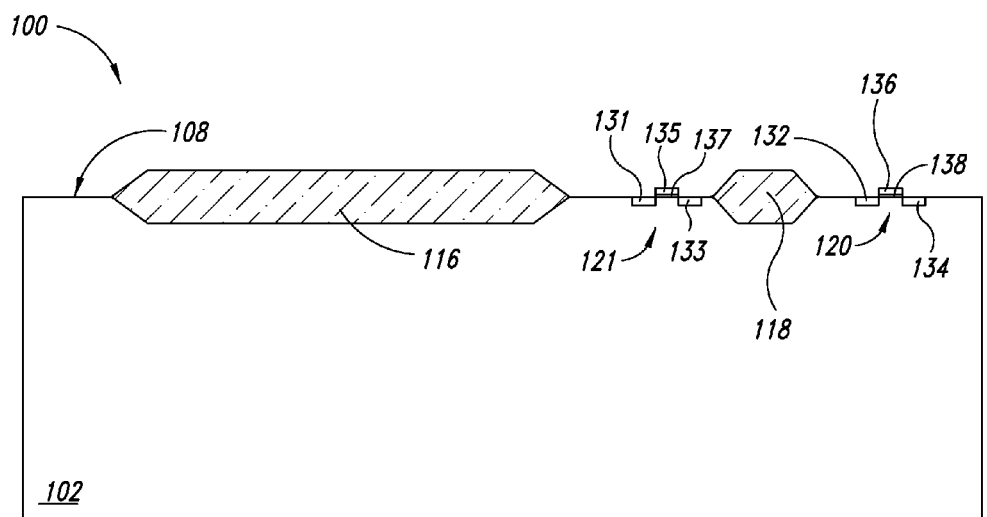

In FIG. 4, transistors 120 and 121 are formed in the substrate 102 at locations spaced from the large field oxide region 116 and separated by the IC FOX 118. The IC FOX 118 acts to prevent parasitic latch up of neighboring transistors 120, 121, but does not participate in device operation. Conventional techniques are used to form the transistors 120 and 121 and will not be described in detail.

Forming the first portion 168 of the chamber 164 with large field oxide region 116 during the same process as forming the IC FOX 118 reduces complexity in the manufacturing process. The LOCOS process is sophisticated, controllable, and commonly utilized in formation of IC components. Incorporating formation of the first portion 168 of the chamber 164 with formation of the IC components significantly reduces process time and cost by eliminating portions of the process directed to protecting chamber components as the IC components are masked, patterned, and etched.

The transistors 121 and 120 each include a source region 131, 132, a drain region 133, 134, and a gate electrode 135, 136, respectively. A thin dielectric layer 137, 138 separates the gate electrodes 135, 136 from the substrate 102. The source 132 of the transistor 120 is separated from the drain region 133 of transistor 121 by IC FOX 118. The size of the IC FOX 118 is selected to sufficiently space the transistors 120, 121 and prevent undesirable parasitic interactions. The transistor 120, 121 can be of any suitable type, such as a MOSFET of LDMOS, VDMOS, etc.

The dielectric layers 137, 138 are formed on the upper surface 108 of the substrate 102, extending at least between the source region 131, 132 and the drain region 133, 134. The gate electrode 135, 136 forms on the respective dielectric layers 137, 138 for controlling current as will be discussed in more detail below with respect to electrical communication. The dielectric layer 137, 138 may include a silicon dioxide, a silicon nitride, a sandwich layer of silicon dioxide and silicon nitride, or some other combination of suitable dielectric material.

The gate electrode 135, 136 can be any acceptable conductive material, such as polysilicon, polysilicon with a silicide layer, metal, or any other conductive layer that is compatible with the process of the present disclosure. The process technology and steps for forming such are known.

Figure 10:
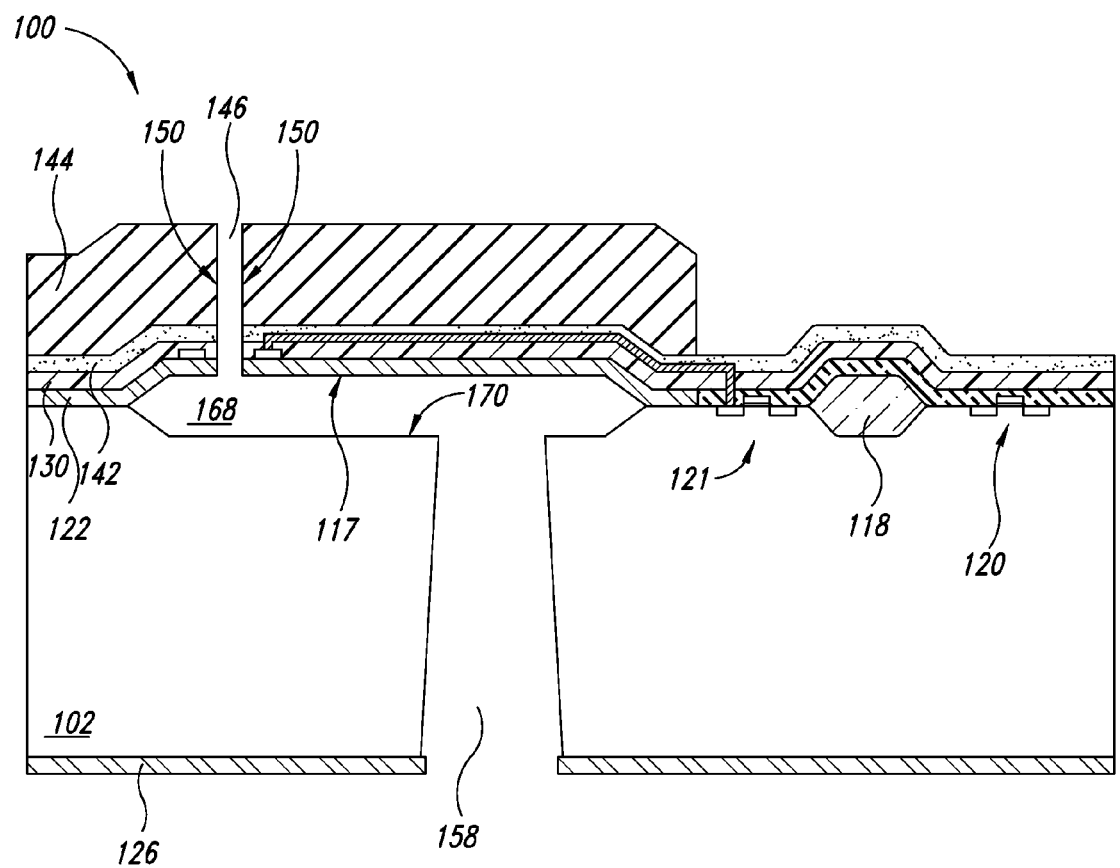
Figure 11:
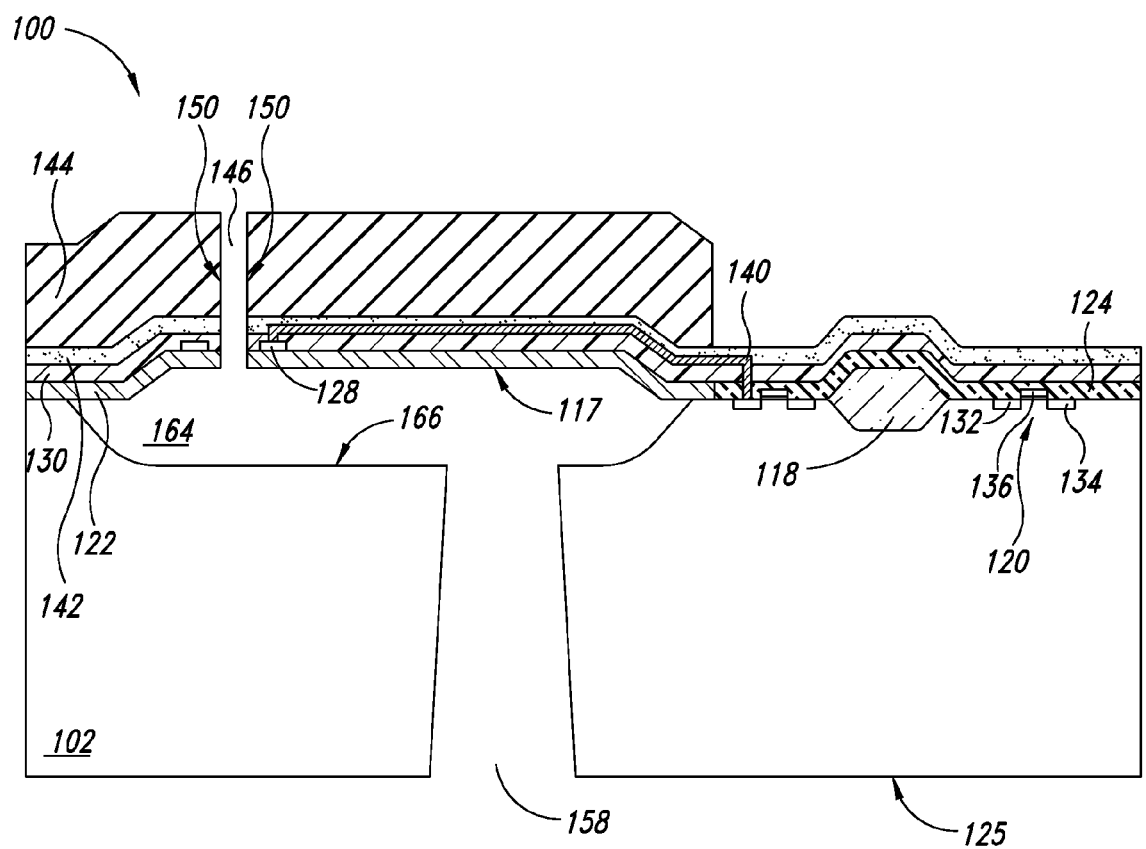

The steps and structure shown and described with respect to FIGS. 1-4 can be used to construct a variety of MEMS components or structures. In one embodiment the steps of FIGS. 1-4 for the formation of the large field oxide region 116 correspond to the portion 168 of the fluid chamber 164 utilized in microfluidic applications, such as ink jet printer chambers as shown in FIGS. 10 and 11. In other embodiments, the steps of FIGS. 1-4 are the initial stages of the process of forming a variety of MEMS device structures that utilize sacrificial layers to form device features. For example, the large field oxide region 116 may correspond to an air gap in a microphone, an accelerometer, a pressure sensor, or other type of sensor. A few examples are illustrated in FIGS. 12-15 below. In these applications, the region of the substrate 102 below the field oxide region 116 may be implanted as described above with respect to FIG. 3.

FIGS. 5-11 show subsequent stages in the process of forming the fluid chamber 164 including formation of heater elements, and the inlet and outlet path. In FIGS. 5-11, the larger field oxide region 116 corresponds to the first portion 168 of the chamber 164 and will be referred to as the chamber FOX 116. In a subsequent stage of the process, the chamber FOX 116 will be removed to open the first portion 168 of the chamber 164.

Figure 5:
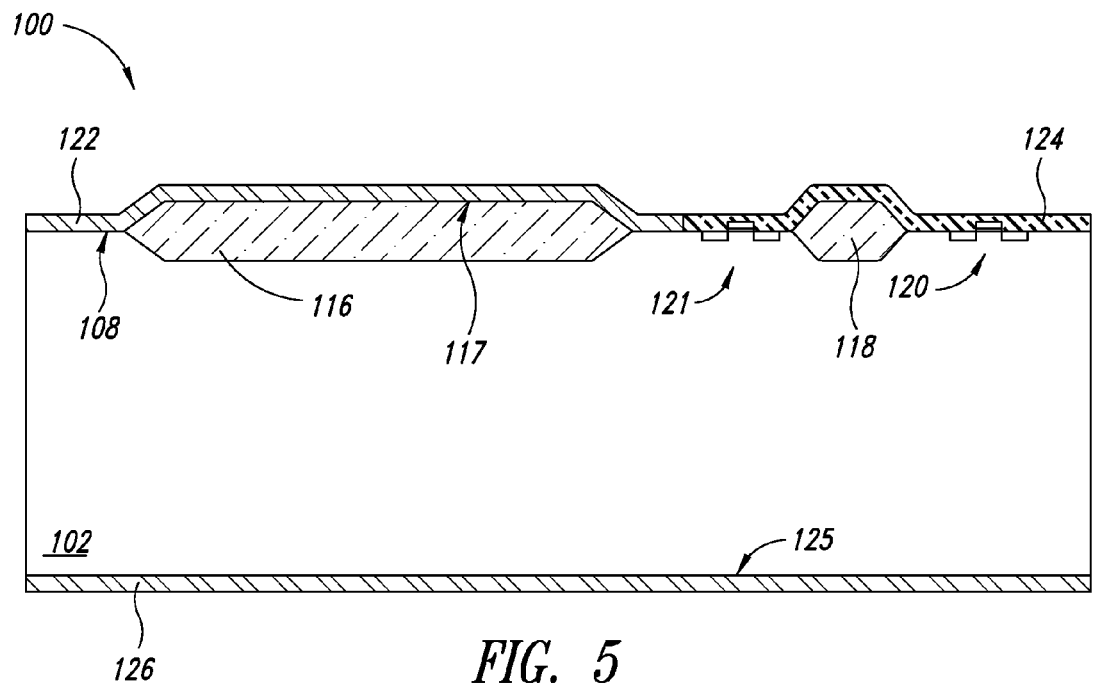

In FIG. 5, an insulation layer 122 is grown or conformally deposited over the upper surface 108 of the substrate, the chamber FOX 116 and the IC FOX 118, and over the transistors 120, 121. The insulation layer 122 can be a combination of layers, such as a pad oxide layer and a nitride layer or equivalent layer. The pad oxide may be covered by the nitride layer, which may have a thickness in the range of 50 to 3,000 Angstroms. The nitride layer may also be deposited in layers, which can include a layer of low-stress nitride. The insulation layer 122 thus may include an oxide directly on the silicon and a nitride deposited on top of the oxide, the nitride being 2 to 30 times thicker than the oxide.

The insulation layer 122 preferably includes a hard and durable material which does not deteriorate despite its thickness and can be subjected to high temperatures. In one embodiment, the dielectric layer 122 includes low-stress nitride, deposited using low-stress nitride deposition methods as are known in the art. Insulation layer 122 may also be carbide or other inert, hard material.

In another embodiment, the insulation layer 122 can be grown on the upper surface 108 of the substrate 102 and over the field oxide regions 116 and 118. The insulation layer 122 electrically isolates the upper surface of the substrate 102. It can be a material with desirable heat transfer properties to prevent the heat from spreading to substrate 102 around the chamber 164.

A back side insulation layer 126 is deposited on the back surface 125 of the substrate 102 as a protection layer for subsequent process steps. The back side insulation layer 126 may be formed of the same low-stress nitride as the insulation layer 122 on the upper surface 108 of the substrate 102, or the insulation layer 126 may be grown. The application of the insulation layer 122 and the back side insulation layer 126 can be in a batch process technique so that both layers evenly coat the wafer in one process.

The insulation layer 122 is patterned and etched to expose the transistors 120, 121 spaced away from the chamber FOX 116 if a different layer is to be formed over the transistors 120, 121. Alternatively, insulation layer 122 can be left in place and also used as the passivation layer over the transistors. In one embodiment, a pre-metal dielectric layer 124 is deposited over the transistors 120, 121.

Subsequently, a heater element 128 is formed by depositing and etching a layer of heater material on the insulation layer 122. The etching leaves behind only a portion of the heater element 128 aligned over the chamber FOX 116. The heater element 128 may be formed of any suitable material for use with semiconductors that produces heat from electrical resistance. For example, the heater element 128 may be Tantalum or Tantalum Aluminum (TaAl). In an alternative embodiment, the heater element 128 may be a high-temperature metallic heater such as an alloy that contains one or more of nickel, silver, or molybdenum, in various combinations. A metal oxide, ceramic oxide, or other sophisticated resistive metal heater element may also be used.

In another embodiment, the heater element 128 is polysilicon, which can be deposited in the same process as for the gates 135, 136. If the gates 135, 136 are doped, the polysilicon for the heater element 128 will not be doped, so that it is comprised of intrinsic polysilicon. Alternatively, the heater element 128 may have very light levels of dopant of P or N so as to slightly increase the resistance and improve the heater properties. The thickness of the heater element 128 may be a different thickness than the gates 135, 136, since the purpose is to function as a heater rather than as a highly conductive gate member. In such situations, even though both layers are poly, they may be deposited in separate steps.

The position of the heater element 128 is above the chamber FOX 116 and adjacent the location of an expected nozzle opening 146, as shown in FIGS. 10 and 11. The nozzle opening 146 will be described in more detail below.

The heater element 128 can be any suitable shape that promotes consistent heating. For example, the heater element 128 can be a torus shape, a hollow cylindrical shape, a solid shape, a square, a rectangle, a star with an opening in the center, a plurality of fingers, or any other suitable shape. In the illustrated embodiment of FIG. 11, the heater element 128 is a square-edged torus shape.

Figure 6:
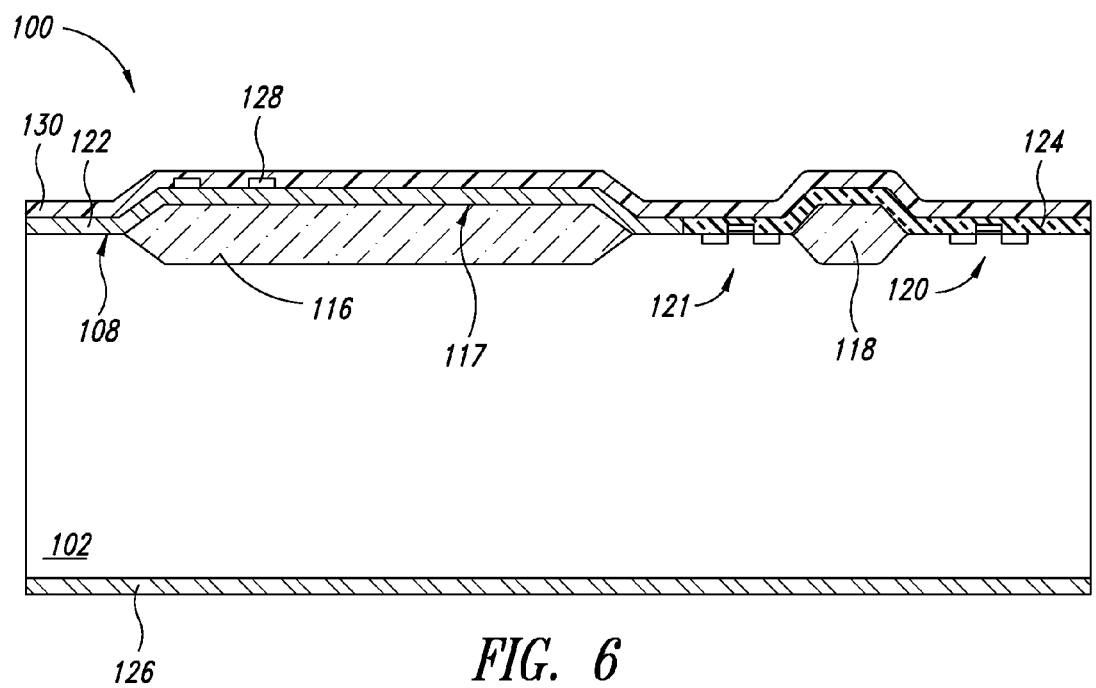

In FIG. 6, an inter dielectric layer 130 is deposited on the heater element 128, the insulation layer 122, and the pre-metal dielectric layer 124. Vias are etched through the inter dielectric layer 130 and the pre-metal dielectric layer 124 to expose a surface of the heater 128 and a surface of the source 132 of transistor 121, respectively.

Figure 7:
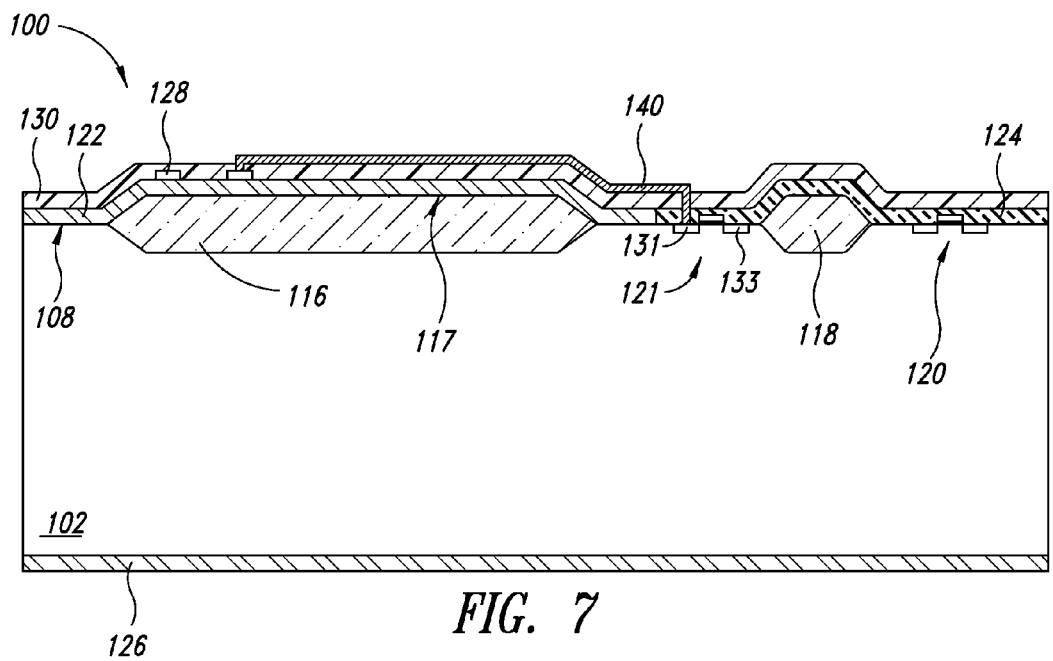

Electrical current from the transistor 121 is supplied to the heater element 128 through vias and interconnect structure 140 (see FIG. 7). The vias can be filled with a conductive plug, such as tungsten, with a Ti/N liner, or filled with another acceptable conductor. This is followed by deposition of a conductive layer, such as a metal, for example silicon doped aluminum, copper, tungsten, or combinations thereof, followed by etching to create the interconnect structure 140. The interconnect structure 140 is selected to be of a material and size such that it will not significantly heat up while carrying the current to the heater element 128.

The process for forming the control circuitry, including the transistors, on the same substrate as heating chambers is well known in the art and the details will therefore not be described. Any of the many known and widely practiced techniques for forming the MOSFETs and other circuits on the substrate 102 with the chamber 164 may be used.

After formation of the control circuitry is complete, a passivation layer 142 is deposited to isolate the transistors 120, 121 and interconnect structure 140. Transistor 120 may coupled to a second heater element through an interconnect structure that is not visible in this cross-section.

Figure 8:
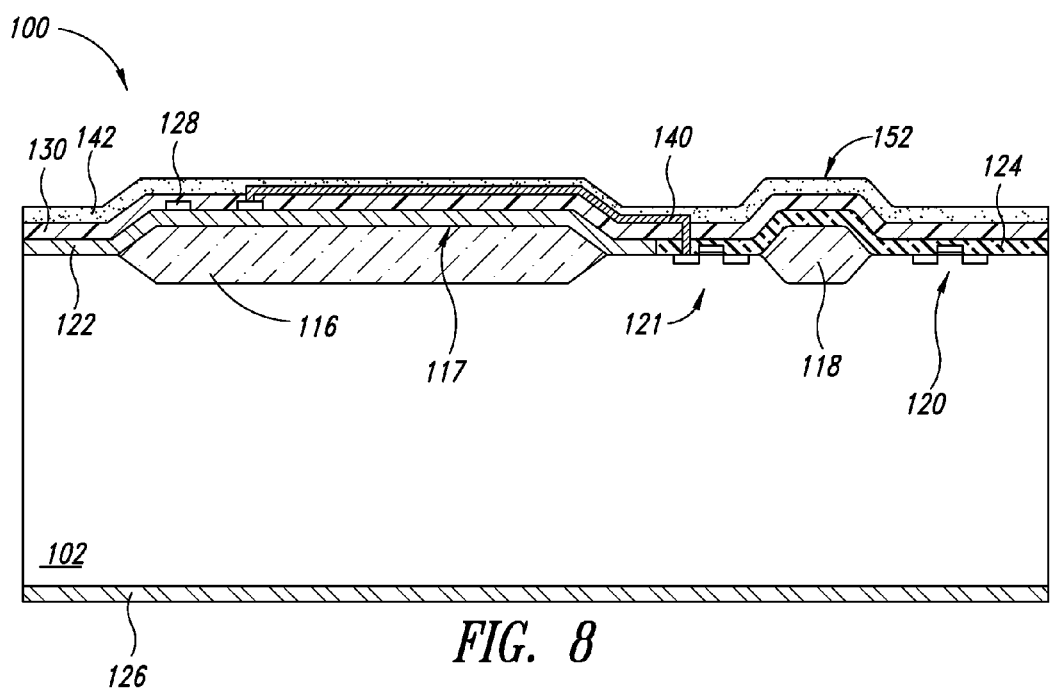

As illustrated in FIG. 8, passivation layer 142 is applied over the dielectric layer 130 and the interconnect structure 140. The passivation layer 142 may be a nitride, a phosphosilicate glass followed by a nitride, a stack of oxide-nitride-oxide, a stack of silicon-oxide-nitride, or other compatible inter-metal insulating layer. In one embodiment, the total height of layers 122, 130, and 142 is one micron. As compared to the desired chamber depth of 20 microns, the stack of layers is very small.

Figure 9:
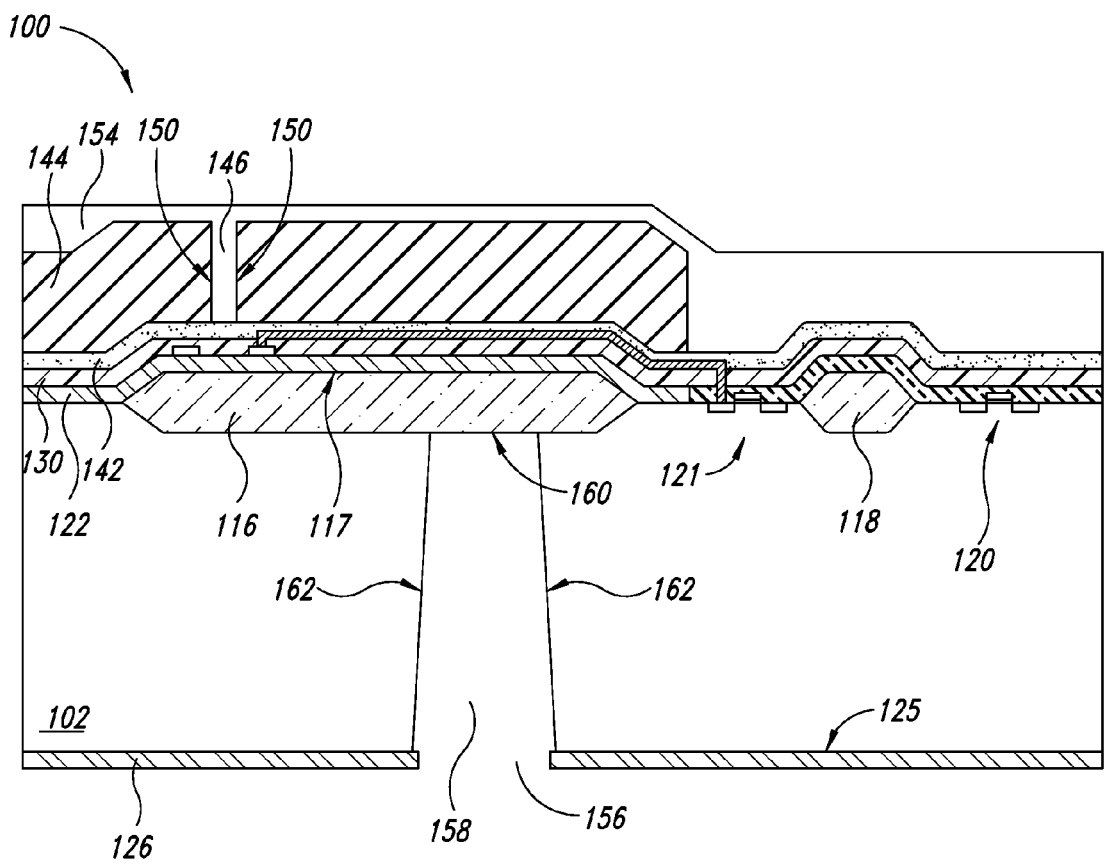

Subsequently, as shown in FIG. 9, metal layer 144 is deposited over passivation layer 142 and functions as a heat sink. The metal layer 144 defines walls 150 of the nozzle 146. The metal layer 144 is deposited by chemical vapor deposition, electroplating, or other suitable technique. In addition, the metal layer 144 only covers the region above the chamber FOX 116 and does not cover a top surface 152 of the passivation layer 142 above the transistor 120. The limited coverage of metal layer 144 decreases the amount of metal necessary to form the heat sink and ultimately reduces the cost per wafer.

In one embodiment, the chamber assembly 100 is utilized to heat fluid in chamber 164 at a location which is distal with respect to the location where the fluid exits. Extremely high temperatures are applied to the fluid in chamber 164, which heats the entire surrounding region. Incorporating the large metal layer 144 prevents excessive heat from affecting neighboring devices and external components, such as other chambers and transistors. In operations using corrosive fluids, such as ink, the metal layer 144 also protects the underlying components from corrosion by the ejected liquid.

Typically, the metal layer 144 is a material that exhibits superior heat absorption and dissipation qualities. Such material is often selected from the metal group of materials, including gold, silver, tungsten, copper, or an aluminum alloy.

The front side of the wafer, including the metal layer 144 and the nozzle opening 146, is covered with a protection layer 154. After deposition of the protection layer 154 the backside insulation layer 126 is masked and etched to form an opening 156 to expose a back surface 125 of the substrate 102. The opening 156 indicates the location where a path 158 through the substrate 102 will be formed. The opening 156 is positioned at a location below the chamber FOX 116, so that in a subsequent stage of the process a bottom surface 160 of the chamber FOX 116 will be exposed by the path 158.

The path 158 through the substrate 102 that exposes the bottom surface 160 of the chamber FOX 116 is formed by etching the substrate 102 through the opening 156 in the insulation layer 126. The opening 156 is positioned below the large chamber FOX 116 at a location away from the nozzle 146. The path 158 is formed using known methods, which include etching steps, such as dry etching, wet etching, layer formation, deposition, lithography, potassium hydroxide etching, or a combination thereof. In one embodiment, a potassium hydroxide (KOH) etch is used to form the path 158.

In FIG. 10, the protection layer 154 is removed to re-expose the walls 150 of the nozzle 146. An etch technique is used to remove the chamber FOX 116 through the path 158 from the back surface 125 of the substrate 102. One technique which may be utilized is a hydrogen fluoride (HF) etch. The HF etch removes materials such silicon dioxide, but does not significantly affect the substrate 102 or insulation layer 122. Removal of the chamber FOX 116 exposes the first portion 168 of the chamber 164, the portion having a top surface 117 and a bottom surface 170. In one embodiment, the distance between top surface 117 and bottom surface 170 is one micron. The insulation layer 122 is resistant to the HF and the KOH etch chemistries so that the selected profile is retained during the etches.

The release of the chamber FOX 116 opens up the portion 168 of the chamber 164 to be in fluid communication with the nozzle 146 and the path 158. A second KOH etch through the path 158 forms the final chamber 164 and exposes a bottom surface 166, see FIG. 11. In a preferred embodiment, a distance between the top surface 117 of the chamber 164 and the bottom surface 166 is in the range of 15-20 microns.

In an alternative embodiment, the final nozzle 146 is defined by a sacrificial material such as an oxide, which can be removed simultaneously with the removal of the chamber FOX 116. The nozzle 146 and the chamber FOX 116 can both be released during the HF etch, so that the nozzle 146 is in fluid communication with the chamber 164 and the path 158. However, the final nozzle 146 may be formed prior to or concurrently with the removal of the chamber FOX 116.

The final chamber assembly 100, illustrated in FIG. 11, includes the chamber 164 formed in the substrate 102 and is in fluid communication with the path 158, the nozzle opening 146, and a surrounding environment. In addition the back side insulation layer 126 is removed to re-expose the back surface 125 of the substrate 102. Walls 150 of the nozzle opening 146 are defined by the thick metal layer 144, which may be gold, tungsten, aluminum, or copper. Preferably, the thick metal layer 144 acts as a protection from corrosive properties of inks or other fluids ejected from the chamber 164.

The chamber 164 receives fluid through the inlet path 158 from a back surface 125 of the substrate 102. The nozzle opening 146 also passes through the insulation layer 122, the inter dielectric layer 130, the passivation layer 142, and the metal layer 144.

The heater element 128 is positioned adjacent the nozzle opening 146, which aids in facilitating movement of the heated fluid through the nozzle opening 146. Some fluids have a viscosity that makes it difficult for them to flow smoothly into small orifices or into small channels, such as nozzle 146. The size and placement of heater element 128 can be selected based on desired performance of the device.

Figure 12:
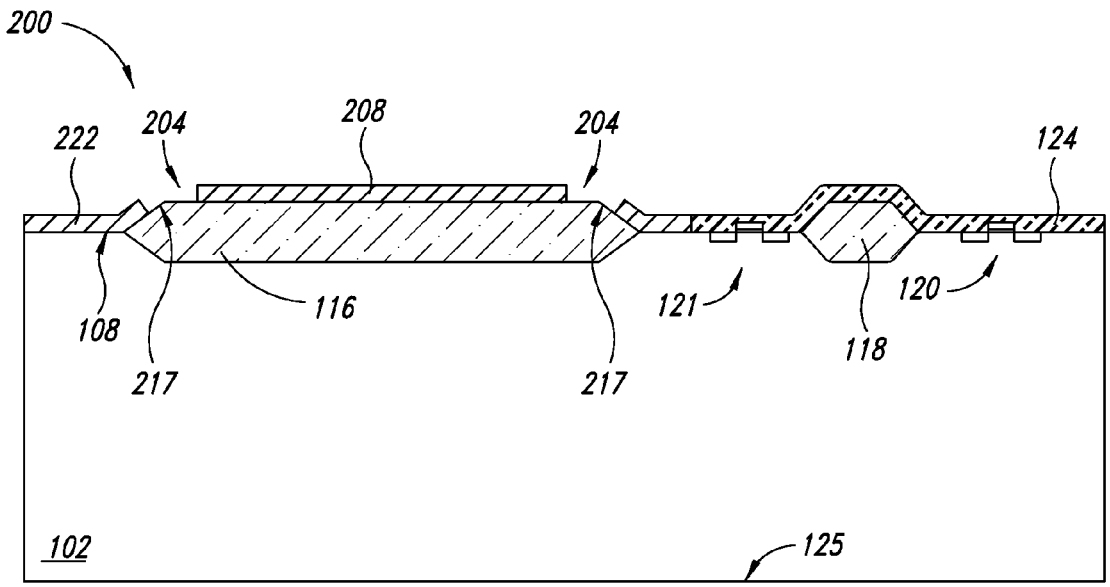
FIGS. 12 and 13 are schematic cross-sections of different stages in a manufacturing process for forming a pressure sensor according to one embodiment of the present disclosure.
Figure 13:
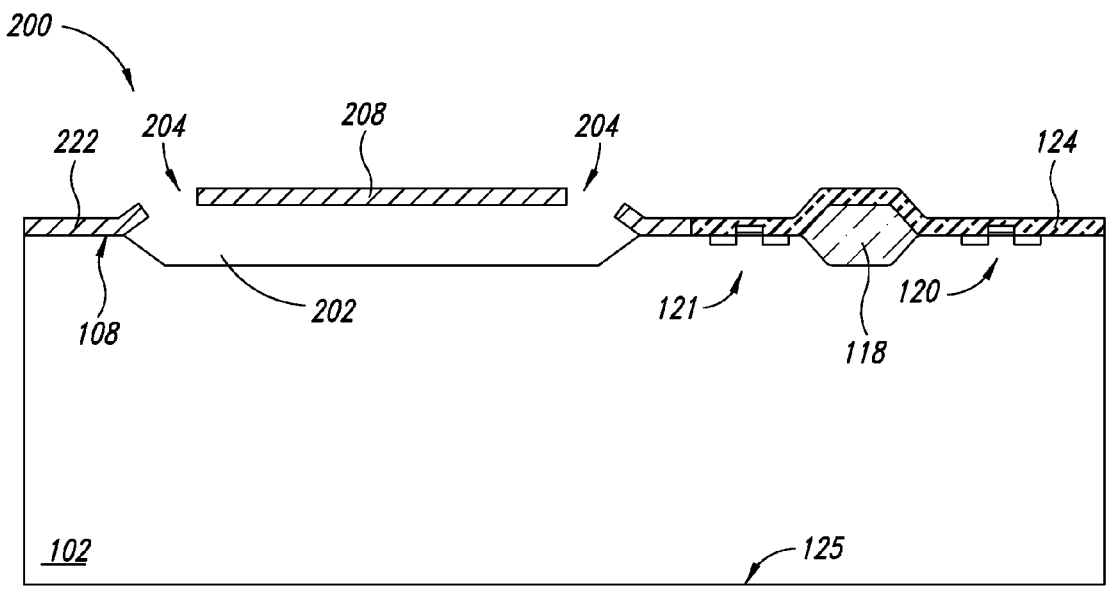

FIGS. 12 and 13 show a pressure sensor assembly 200 formed subsequently to the initial stages described above with respect to FIGS. 1-4. As previously noted, the substrate 102 may be doped silicon of a desired conductivity type, either P-type or N-type. During the same stage of the process the large field oxide region 116 and the IC FOX 118 grow concurrently on the top surface 108 of the substrate 102, which may be covered by the pad oxide 104 and patterned nitride layer 106 (see FIG. 2). In this embodiment, the field oxide region 116 corresponds to a recess 202 to be formed in a subsequent stage of the process. The smaller IC FOX 118 is the isolation region between transistors 120 and 121 formed on the substrate 102, as shown in FIG. 4.

FIG. 12 illustrates a conductive layer 222 deposited over the field oxide region 116, the substrate 102, and transistors 120,121. The conductive layer 222 may be patterned and etched to re-expose the transistors 120,121 and the field oxide region 118 if another layer will be deposited over these elements, such as the pre-metal dielectric layer 124. A region below the field oxide region 116 may be implanted to have a conductivity of P-type or N-type, as described above with respect to FIG. 3. The region may be included to act as a plate of a capacitor as discussed below in FIGS. 14 and 15.

The conductive layer 222 is patterned and etched to form apertures 204 that expose a top surface 217 of the field oxide region 116. The apertures 204 are patterned and etched so that a first portion (not shown) of the conductive layer 222 remains attached to the substrate. The conductive layer 222 may be any acceptable conductor, such as a metal layer of tungsten, titanium, tantalum, aluminum, or a doped polysilicon layer.

Figure 14:
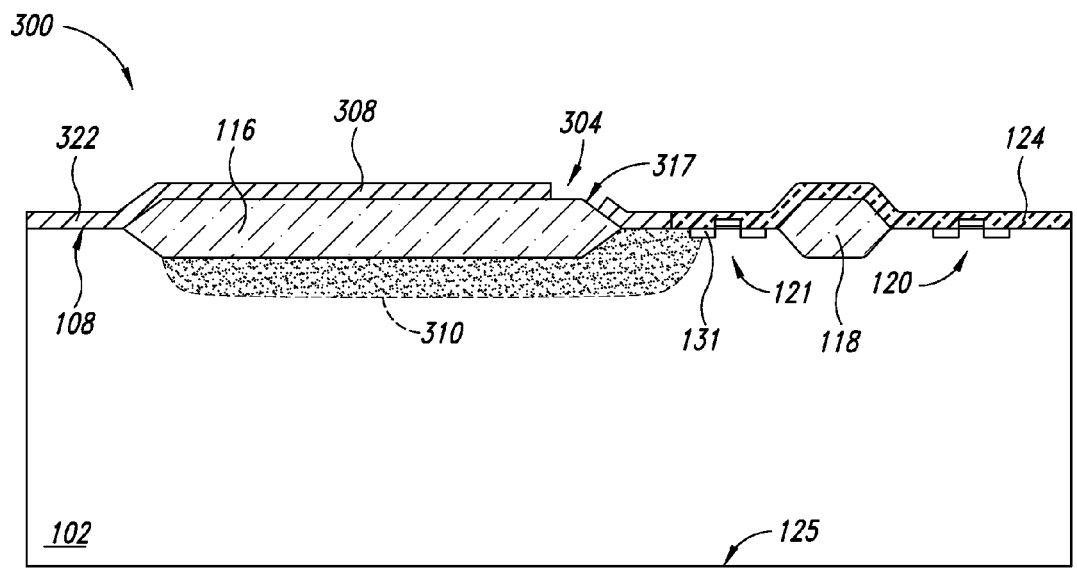
FIGS. 14 and 15 are schematic cross-sections of different stages in a manufacturing process for forming a cantilever according to one embodiment of the present disclosure.
Figure 15:
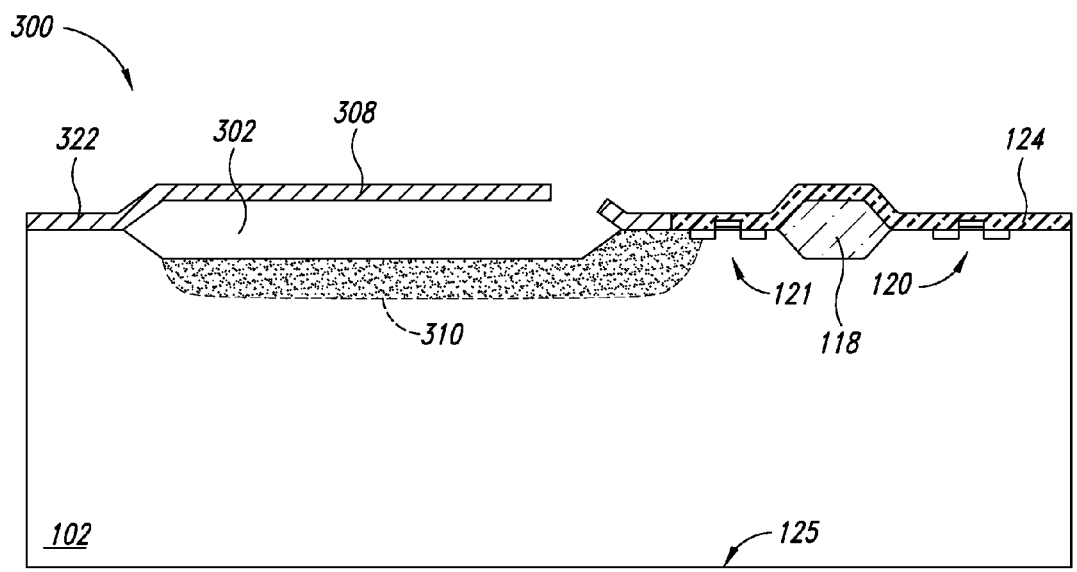

FIG. 13 illustrates the recess 202 that is exposed after the field oxide region 116 is removed through apertures 204 with an etch technique. The first portions of the conductive layer 222 attach to the substrate 102 at a boundary of the apertures 204 away from the cross-section illustrated. A second portion 208 of the conductive layer 222 is moveable at a distance spaced from the first portions. The second portion 208 is illustrated as suspended without support in FIG. 13 because the cross-section shown does not pass through the first portion of the conductive layer 222 attached to the substrate 102. The second portion 208 is a flexible suspended beam that deforms when there is a change in pressure. The conductive beam may act as one plate of a capacitor for detecting changes in pressure and the other plate of the capacitor may be the heavily implanted region below the field oxide region 116 as illustrated in FIGS. 14 and 15. The size of field oxide region 116 may be selected by a manufacturer based on the desired size, shape, and location of the suspended beam, i.e., the second portion 208.

FIGS. 14 and 15 illustrate another embodiment of the present disclosure, which may be an accelerometer or other cantilevered device. Formation of a cantilever assembly 300 also follows the same initial stages of the process described above with respect to FIGS. 1-4. The field oxide regions 116 and 118 are grown concurrently on the upper surface 108 of the substrate 102 using standard LOCOS or other oxide forming techniques. The large field oxide region 116 corresponds to an opening 302 to be formed later in the process. The field oxide region 118 isolates the transistors 120, 121 and prevents parasitic interference between the transistors.

FIG. 14 illustrates the heavy implant region 310 below the large field oxide region 116 that may be formed subsequent to the process described in FIG. 3 above. The heavy implant region 310 may be an extension of the source region 131 of transistor 121. The extension of the source region 131 provides access to the heavy implant region 310, which may be one plate of a capacitor for detecting changes in certain parameters. The other plate of the capacitor being a conductive layer 322 described below.

FIG. 14 shows the conductive layer 322 deposited over the field oxide region 116, the substrate 102, and the IC components. In one embodiment, the conductive layer 322 is patterned and etched to expose the IC components if a protection layer is to be deposited, for example, the pre-metal dielectric layer 124. The conductive layer 322 may be any acceptable conductor, such as a metal layer of tungsten, titanium, tantalum, aluminum, or a doped polysilicon layer.

An aperture 304 is formed in the conductive layer 322 that exposes a top surface 317 of the field oxide region 116. The conductive layer 322 forms a cantilever 308 that attaches to the substrate 102 and extends over the field oxide region 116 to a boundary of the aperture 304.

FIG. 15 illustrates the cantilever 308 suspended over the opening 302 that was formed by removing the field oxide region 116. The cantilever 308 may be utilized in an accelerometer or other cantilever sensor. For example, a different pattern may be applied intermittently along the conductive layer 322 to form a comb-like pattern of cantilevers 308.

The formation of field oxide regions directed to the IC components concurrently with field oxide regions directed to MEMS structures is not limited to the embodiments discussed above. Other MEMS structures may be efficiently formed with the disclosed process of forming sacrificial field oxide regions in parallel with the IC components. Accelerometers, microphones, DNA amplification chambers, release beam sensors, and other MEMS sensors are a few of the devices where the manufacturing process may be simplified and made more efficient by forming MEMS structures concurrently with the IC components.

These examples are provided to demonstrate that utilizing field oxide regions in forming the chamber reduce the complexity of the manufacturing process and fall within the scope of the claims that follow. Additionally, forming the large chamber field oxide 116 concurrently with formation of the IC field oxide 118 reduces the process time and steps required to form the final MEMS device, such as chamber assembly 100.

Various modifications and combinations of the component arrangements shown herein can be made that fall within the scope of the present disclosure. For example, the heater elements' arrangement, size, and number may be combined in various modifications. Also, various chambers, recesses, or trenches may be formed by the large field oxide region 116 to meet the needs and specifications of the final device.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   forming a first oxide region and a second oxide region concurrently in a substrate, the first oxide region having a first width and a first depth;
   forming an inlet path to the first oxide region, the inlet path exposing a first surface of the first oxide region;
   removing substantially all of the first oxide region to form a portion of a chamber, the removing exposing an internal surface of the substrate;
   forming a first MOS transistor adjacent to the second oxide region;

forming a second MOS transistor separated from the first MOS transistor by the second oxide region; and etching the internal surface of the substrate to enlarge the chamber, the chamber having a second width that is greater than the first width and a second depth that is greater than the first depth.

2. The method of claim 1 wherein the first oxide region is at least two times wider than the second oxide region.

3. The method of claim 1, further comprising:
forming an outlet path in a metal layer, the outlet path exposing a second surface of the first oxide region.

4. The method of claim 3 wherein the chamber is in fluid communication with the inlet path, the outlet path, and a surrounding environment.

5. A method, comprising:
forming a plurality of field oxide regions concurrently in a substrate, the plurality of field oxide regions including a first field oxide region and a second field oxide region;
forming a first opening to expose a first surface of the first field oxide region;
forming a first MOS transistor on the substrate between the first field oxide region and the second field oxide region, the first MOS transistor spaced from an end of the first field oxide region by a first distance;
forming a second MOS transistor on the substrate, the second transistor separated from the first MOS transistor by the second field oxide region;
removing the first field oxide region to form a portion of a chamber, the portion exposing an internal surface of the substrate; and
etching the internal surface of the substrate to enlarge the chamber, an end of the chamber spaced from the first MOS transistor by a second distance that is less than or equal to the first distance.

6. The method of claim 5, further comprising:
forming a protection layer on the first field oxide region;
forming the first opening through the protection layer and forming a second opening through the substrate to expose a second surface of the first field oxide region
to enable the enlarging of the chamber, the chamber being in fluid communication with the first opening, the second opening, and a surrounding environment.

7. The method of claim 6 wherein the protection layer is formed from a material resistant to an etchant used in etching the substrate.

8. The method of claim 6 wherein the protection layer forms a top surface of the chamber.

9. The method of claim 6 wherein the first surface of the first field oxide region is adjacent to the protection layer and the second surface of the first field oxide region is adjacent to an internal surface of the substrate.

10. The method of claim 9 wherein a top surface of the chamber corresponds to the first surface of the first field oxide region and a bottom surface of the chamber is at a location below the second surface of the first field oxide region.

11. The method of claim 10 wherein a distance between the top surface and the bottom surface of the chamber is at least two times larger than a distance between the first surface and the second surface of the first field oxide region.

12. The method of claim 5, further comprising:
forming a heater element on the first field oxide region, aligned with the first opening, and coupled to one of the MOS transistors, the heater element configured to generate heat when subjected to an electrical current from the MOS transistor to heat fluid in the chamber to a target value.

13. A method, comprising:
forming a masking layer on a substrate;
etching a first and a second opening in the masking layer to expose a surface of the substrate;
growing a first and a second oxide region concurrently in the substrate at the first and second openings, the first oxide region having a first width and a first depth;
forming an insulation layer on the first oxide region;
forming a nozzle through the insulation layer to expose a first surface of the first oxide region;
forming a first and a second transistor separated by the second oxide region;
removing substantially all of the first oxide region to form a portion of a chamber, the portion exposing an internal surface of the substrate; and
etching the internal surface of the substrate to enlarge the chamber, the chamber having a second width that is greater than the first width of the first oxide region and a second depth that is greater than the first depth of the first oxide region.

14. The method of claim 13, further comprising:
forming a protection layer on the first oxide region;
forming the nozzle through the protection layer; and
forming a path through the substrate to expose a second surface of the first oxide region enabling the
etching of the internal surface of the substrate to form of the chamber, the chamber being in fluid communication with the path, the nozzle, and a surrounding environment.

15. The method of claim 14, further comprising:
forming a heater element on the first oxide region and aligned with the nozzle, the heater element coupled to one of the transistors to heat fluid in the chamber to a target value.

16. The method of claim 14 wherein the protection layer is formed from a material resistant to an etchant used in etching the internal surface of the substrate to form a bottom surface of the chamber in the substrate.

17. A method, comprising:
forming a first oxide region and a second oxide region concurrently in a substrate;
forming a conductive layer on the first oxide region;
exposing a top surface of the first oxide region through at least one opening in the conductive layer;
forming a first transistor adjacent to the second oxide region;
forming a second transistor separated from the first transistor by the second oxide region; and
removing the first oxide region through the at least one opening in the conductive layer, the removing forming at least one moveable end of the conductive layer extending over a recess in the substrate.

18. The method of claim 17 wherein the conductive layer is connected to the substrate at a first location.

19. The method of claim 18 wherein the moveable end is part of a cantilever beam formed from the conductive layer, the cantilever beam being moveable at a second location spaced from the first location by a selected distance.

* * * * *